(12) United States Patent
Azenkot et al.

(10) Patent No.: US 9,008,255 B1
(45) Date of Patent: Apr. 14, 2015

(54) JITTER MITIGATING PHASE LOCKED LOOP CIRCUIT

(71) Applicant: Applied Micro Circuits Corporation, Sunnyvale, CA (US)

(72) Inventors: Yehuda Azenkot, San Jose, CA (US); Timothy P. Walker, Boxford, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 14/061,307

(22) Filed: Oct. 23, 2013

(51) Int. Cl.
*H04L 7/033* (2006.01)
(52) U.S. Cl.
CPC .................... *H04L 7/0331* (2013.01)
(58) Field of Classification Search
CPC ...................... H04L 2027/0067; H04L 7/0331; H04B 10/6165
USPC ........................... 375/371–376; 327/147–163
See application file for complete search history.

(56) References Cited

U.S. PATENT DOCUMENTS

2002/0180548 A1* 12/2002 Mattisson et al. ............ 332/127

* cited by examiner

*Primary Examiner* — Curtis Odom

(57) ABSTRACT

Systems and methods for efficient jitter mitigation or removal from a gapped signal. A phase mitigation module is employed to generate discrete correction values for modifying phase error signals detected between a gapped signal and a feedback signal of the PLL. The correction values can be digitally subtracted from the output of a phase frequency detector associated with the PLL. The sequence of correction values can be determined based on phase frequency differences between the input signal and a targeted feedback signal that is free of jitter and has a period equal to an average period of the input signal. An average of the correction values is substantially equal to zero, and an average of the modified phase error signal is substantially equal to zero.

20 Claims, 12 Drawing Sheets

JITTER MITIGATING PHASE LOCKED LOOP CIRCUIT

CROSS-REFERENCES

The present disclosure is related to: the co-pending patent application titled "METHOD AND APPARATUS FOR GAPPING," filed on Mar. 18, 2013 and Ser. No. 13/846,171; and the co-pending patent application titled "FREQUENCY SYNTHESIS WITH GAPPER," filed on Mar. 18, 2013 and Ser. No. 13/846,311. The foregoing related patent applications are herein incorporated by reference.

TECHNICAL FIELD

The present disclosure relates generally to the field of electronics, and, more specifically, to the field of frequency synthesis.

BACKGROUND

Gapped signals are widely used in Optical Transport Network (OTN) applications, broadcast video as well as many other application areas. One of the requirements of an OTN is to insert plesiochronous payloads into an OTN wrapper. That is, because the data transmission rate and the rate of the payload source may not be exactly the same, they may drift with respect to one another. One approach to solve the issue to is to generate a reference clock with missing clock edges (or gaps) to maintain the incoming and outgoing data rates synchronized.

A gapped signal by its nature carries significant jitter, which usually is not tolerated by the downstream consumer circuitry. A jitter attenuating Phase Locked Loop (PLL) circuit is typically used to create an output signal that has the same average frequency as the gapped signal with the jitter component attenuated.

A frequency synthesizer may utilize a gapper and a jitter attenuating PLL to receive an input signal with frequency $f_i$ and generate an output signal with frequency $f_o$, where $D=1/R=f_i/f_o$ is usually a rational number. The frequency ratio R can be a rational number expressed as a ratio of integer numbers, S/T.

FIG. 1 illustrates a frequency synthesizer 100 employing a gapper 110 and integer dividers 120, 135, and 134 to generate an output signal 102 with a desired frequency. In the illustrated embodiment, the frequency synthesizer 100 comprises a gapper 110, a PLL 130, and a first integer divider 120 coupled between the gapper 110 and the PLL 130. The first integer divider 120 has an integer divide ratio of N2. The PLL 130 comprises a phase detector 131 coupled with a loop filter 132, an oscillating component, e.g., a Digital-Controlled Oscillator (DCO) 133 or Voltage Controlled Oscillator (VCO), coupled with the loop filter 132, a second integer divider 134 with an integer divide ratio of N3 coupled with the DCO 133. The second integer divider 134 operates to generate an output signal 102 of the frequency synthesizer 100. The PLL also comprises a third integer divider 135 with an integer divide ratio of N1 and disposed in the feedback loop. The gapper 110 can operate to divide a clock signal by a non-integer value, usually a national number (ratio of two integers), e.g., G=P/Q.

Conventionally, a PLL is set to a low bandwidth in order to attenuate the jitter from the gapped signal generated by a gapper, which greatly limits the applications of the PLL. For example, a bandwidth of 300 Hz is specified in ITU-T G.8251 for demapping purposes. Plus, the resultant jitter attenuation efficiency is also typically unsatisfactory.

SUMMARY OF THE INVENTION

Provided herein includes a mechanism for efficient mitigation or removal of jitter using a phase locked loop (PLL) circuit without limiting the bandwidth of the PLL. Accordingly, embodiments of the present disclosure advantageously employ a phase mitigation module in a PLL-based frequency synthesizer to mitigate or remove jitter by adding discrete correction values for offsetting the phase differences between an input signal with jitter, e.g., a gapped signal, and a feedback signal of the PLL. The phase mitigation module is configured to generate a sequence of correction values which are digitally subtracted from the output of a phase frequency detector (PFD) associated with the PLL. The sequence of correction values can be determined based on phase frequency differences between the input signal and a targeted feedback signal that is free of jitter and has a period equal to an average period of the input signal. An average of the correction values is substantially equal to zero such that they do not affect the PLL performance. Further, an average of the modified phase error signal is substantially equal to zero such that jitter or noise that is present at the PFD output can be reduced or removed. As a result, the PLL bandwidth is not restricted by the jitter removal mechanism, and the PLL can advantageously output a signal with jitter mitigated effectively.

In one embodiment, the method pertains to reducing jitter from input signals, the method comprising: (1) providing an input signal to a phase locked loop (PLL), the input signal comprises jitter components; (2) generating a first phase error signal based on phase frequency differences between the input signal and a feedback signal of the PLL; and (3) generating a second phase error signal by offsetting the first phase error signal with a sequence of correction values, wherein an average of the sequence of correction values is substantially equal to zero, and wherein an average of the second phase error signal is substantially equal to zero.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
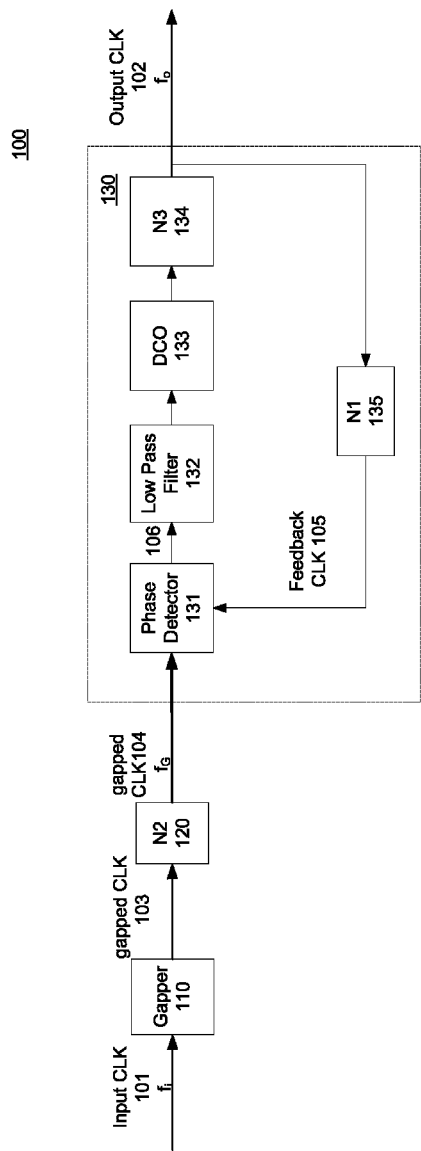
FIG. 1 illustrates a frequency synthesizer employing a gapper and integer dividers and to generate an output signal with desired frequency in accordance with the prior art.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Jitter-Mitigating Phase Locked Loop Circuit

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

Figure 2A:
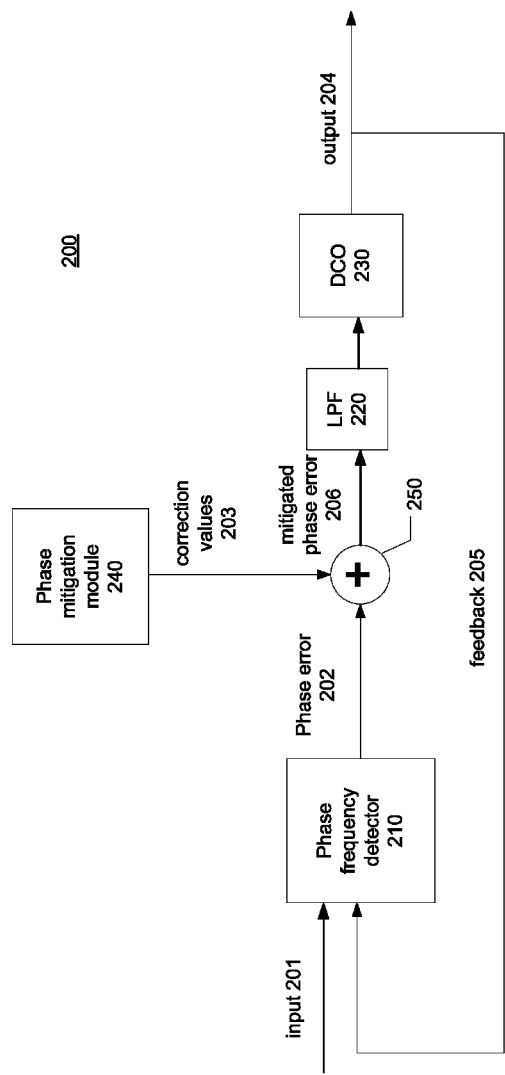
FIG. 2A is a function block diagram illustrating an exemplary configuration of a phase locked loop (PLL) employing a phase mitigation module in accordance with an embodiment of the present disclosure.

FIG. 2A is a function block diagram illustrating an exemplary configuration of a phase locked loop (PLL) 200 employing a phase mitigation module 240 in accordance with an embodiment of the present disclosure. For illustrative purposes, the PLL 200 is in a illustrative form comprising a phase frequency detector (PFD) 210, a low-pass loop filter (LPF) 220, a digital controlled oscillator 230, and the phase mitigation module 240. The input signal includes jitter components, for example generated by a gapper, to be filtered by the PLL 200. The PFD can generate a phase error signal 202 based on the phase difference between the input signal 201 and the feedback signal 205. The phase mitigation module can generate a sequence of correction values 203 based on the signal pattern of the input signal, e.g., frequency, locations in time of the gaps and the pulse rising edges. The correction values are used to mitigate, or correct, the phase error signal 202, e.g. by use of the adder 250 in the illustrated example. The mitigated phase error signal 206 is then used to control the DCO 230 through the LPF 220. The DCO 230 can then generate an output signal 204 with significantly reduced jitter. In some embodiments, the correction values are generated such that an average of the mitigated phase error signal 206 is substantially equal to zero, advantageously resulting in an output signal substantially jitter-free. As will be discussed in greater details, in some embodiments, the average or mean of the correction values 203 can be substantially equal to zero so that the PLL loop performance is not impacted thereby.

Figure 2B:
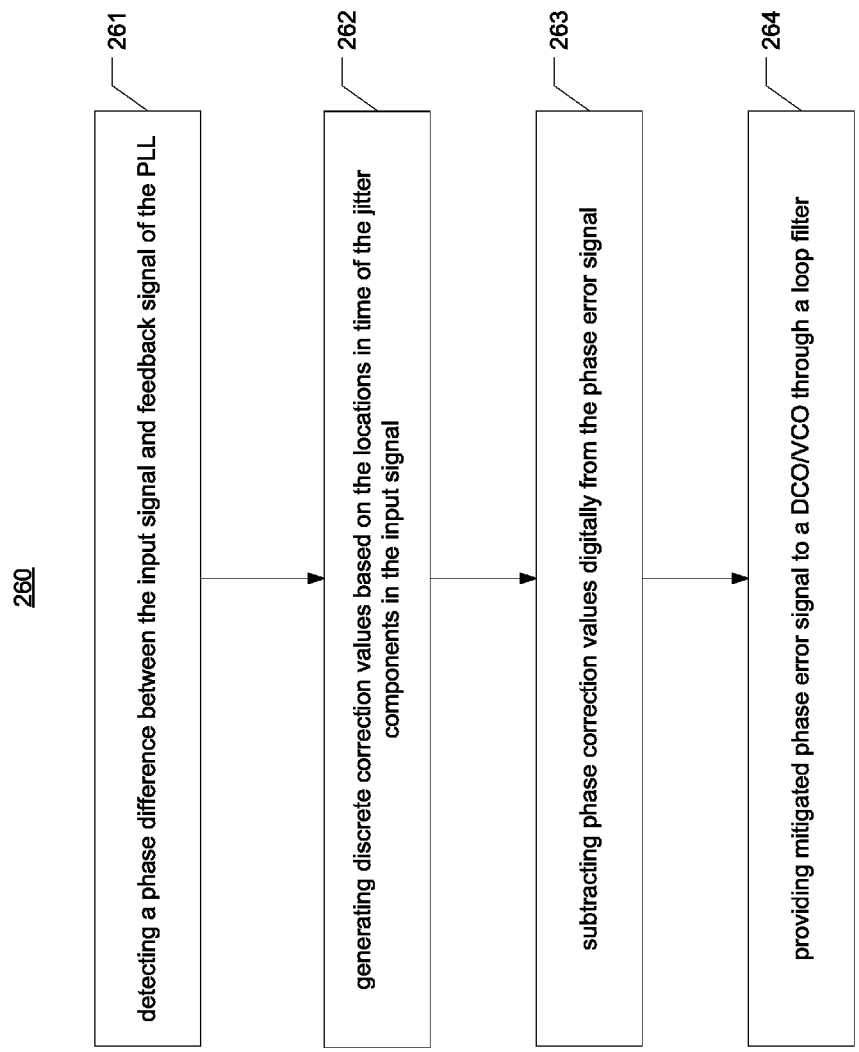
FIG. 2B is a flow chart illustrates an exemplary method of removing jitter from an input signal through a PLL by virtue of phase error signal mitigation in accordance with an embodiment of the present disclosure.

FIG. 2B is a flow chart illustrates an exemplary method 260 of removing jitter from an input signal through a PLL by virtue of phase error signal mitigation in accordance with an embodiment of the present disclosure. At 261, a phase difference between the PLL input signal, e.g., a gapped signal, and the feedback signal, e.g., the PLL output signal divided by an integer number, of the PLL is detected. In some embodiments, a phase difference generation can be derived based on a gapper register Reg0 321 value, as will be described in greater detail with reference to FIG. 3A. At 262, a sequence of correction values are generated and provided to the PLL for phase error signal modification. The correction values may be digital in some embodiments. In some embodiments, the correction values may be predetermined based on the predicated locations in time of the jitter components in the input signal. In some other embodiments, the correction values may be generated in substantially real-time in response to the input signal by virtual of circuitry and/or software implementation. At 263, the sequence of correction values are sequentially subtracted from the phase error signal at corresponding locations in time, thereby generating a mitigated phase error signal. At 264, the mitigated phase error signal is used to control the DCO or the VCO of the PLL through a loop filter to generate the PLL output signal.

Figure 3A:
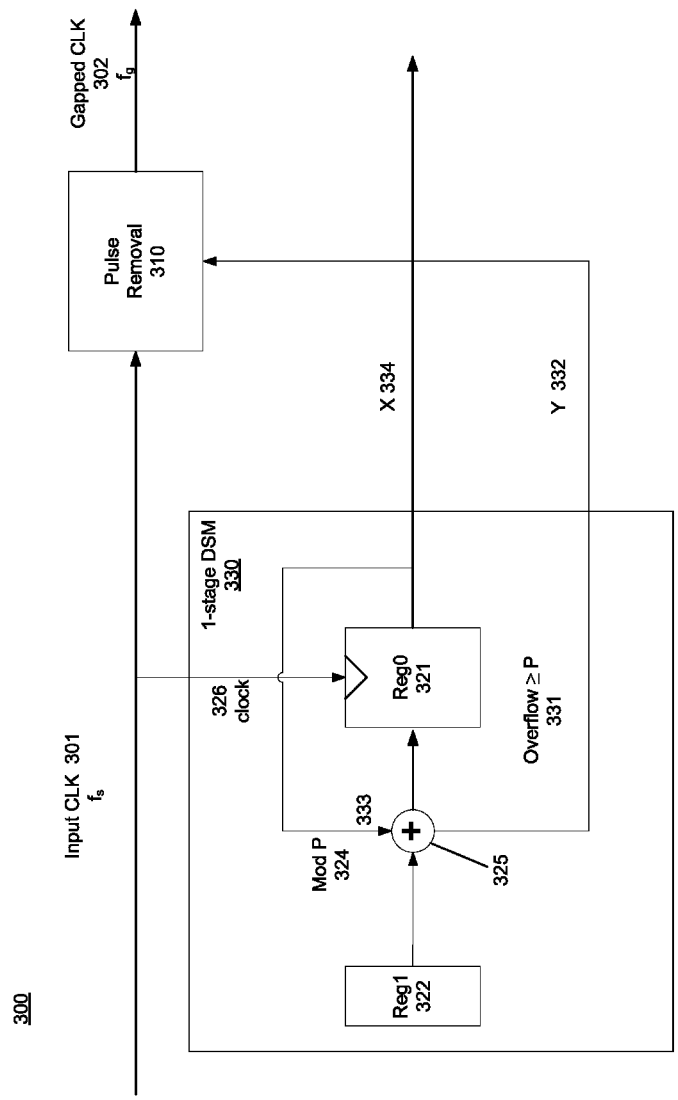
FIG. 3A illustrates an exemplary configuration of a gapper operable to generate a gapped clock comprising jitter components that can be reduced in accordance with an embodiment of the present disclosure.

A PLL equipped with a phase correction module in accordance with an embodiment of the present disclosure may be used to reduce jitter from a gapped signal that is generated by a gapper through a pulse removal process. The phase correction values provided by the phase correction may be dependent on the signal pattern of the gapped signal. FIG. 3A illustrates an exemplary configuration of a gapper 300 operable to generate a gapped clock 302 comprising jitter components that can be advantageously reduced in accordance with an embodiment of the present disclosure.

The gapper 300 comprises a pulse removal unit 310 and a 1-stage delta sigma modulator (DSM) to generate gapping control signals Y 332 to control a rate of generating gaps by the gapping circuit 310. The gapper is configure to receive the input CLK 301 with frequency $f_s$ and output a gapped CLK 302 with average frequency equivalent to $f_G$. The 1-stage DSM 320 comprises a clock input 326 configured to receive a clock signal, a first register Reg0 321 used for storing Reg0 value, a second register Reg1 322 used for storing a preset number M1, a modulo component 324, an adding component 325 coupled with Reg0 321 and Reg1 322. In the illustrated embodiment, the input CLK 301 serves as the clock signal 326 supplied to Reg0 321. In some other embodiments, other suitable signals can be used as clock signal for Reg0 321. In some embodiments, the modulo component 324 is integrated with the adding component 325 in the adder 325.

In the illustrated embodiment, $f_G = f_i/(P/Q)$, where P and Q are integer and P is greater than Q. Thus, for every P pulses received as the input signal, the gapper 300 is capable of generating an equivalent of Q pulses by removing (P−Q) pulses.

In the illustrated embodiment, the pulse removal resolution of the gapper 300 is adjustable with M1 value. In some embodiments, M1 is set to K(P−Q), where K is a positive integer, e.g. 1, 2, 3, . . . . In response to a pulse removal control signal 332, the pulse removal circuit can remove a 1/K portion of a pulse. For example, when K is equal to 1, the gapper can remove a full pulse from the input CLK 301; when K is equal to 2, the gapper is capable of removing a half pulse. However, in some embodiments, regardless of the different resolution adopted, the gapper can remove an equivalent of Q pulses from a window of P pulses in the input CLK, and thus has a frequency ratio of P/Q.

According to the illustrated embodiment, during a clock cycle, Reg0 value is added with M1 by the adding component 325, and the modulo component 324 perform (Reg0+M1) modulo M2, where M2 is set to P in the illustrated example. The remainder 333 of the modulo operation is supplied to Reg0 321 to update the value stored therein.

Whenever an overflow occurs as a result of the above operations in a certain cycle, e.g., Reg1+Reg0≥P, the overflow value can be compared with M2 (=P). The result of the comparison is converted to a gapping control signal Y 332 that is used to control the pulse removal circuit 310 to remove a 1/K portion of a pulse. K is equal to 1 in the illustrated example. When the modulo P has an overflow, the DSM output Y 332 is set to 1. Otherwise, Y 332 is set to 0. The values in register Rge0 generated in respective clock cycles can also be output as X 334.

In some other embodiments, during a clock cycle, the adder 325 performs adding M1 with Reg0 and provides the result to the modulo component 324 to perform modulo M2. The remainder of MOD(((M1+Reg0), M2) is then provided to update Reg0 321. At its output, the modulo component 334 can also provide an overflow Y 332 to the gapping circuit 310.

Figure 3B:
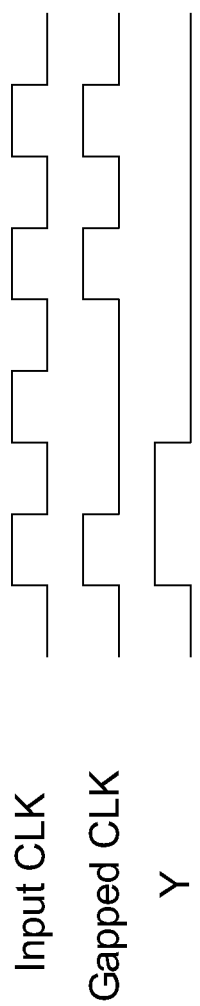
FIG. 3B illustrates exemplary time diagrams of an input clock, a gapped clock and Y associated with a gapper that is similar with FIG. 3A.

FIG. 3B illustrates exemplary time diagrams of an input clock, a gapped clock and Y associated with a gapper that is similar with FIG. 3A. As shown, when Y=1, a pulse is removed from the input CLK, resulting in a gap in the gapped CLK. In response to P clocks of the input clock fed to the gapper, a window of Q gapped clocks with P−Q gaps can be generated by the gapper. Thus, at the gapper output, in a window of Q clocks, P−Q clocks have a period of $$2T_S\left(=\frac{2}{f_s}\right),$$

and the rest Q−(P−Q) clocks have a period equal to the period of the gapper input clock, $T_s$. Thus, the gapped CLK has a large amount of jitter to be filtered out by a PLL.

The average period of the gapped clock, $T_G$, is a division of the gapper input clock. The averaged period of the Gapped CLK can be given by:

$$T_G = \frac{(P-Q)\cdot 2 \cdot T_S + (Q-(P-Q))\cdot T_S}{Q}$$

$$T_G = \frac{P}{Q}\cdot T_S$$

$$T_G = G \cdot T_S.$$

Referring to FIG. 1. Since the PLL multiplies the gapped clock by N1/N2, the frequency of the output clock, $f_s$, can be given by:

$$f_o = \frac{N_1}{N_2} \cdot \frac{1}{T_G}$$

Here, the gapper Input CLK, $f_s$, equals to the input clock, $f_i$, Therefore, the PLL output clock, $f_o$, can be given by:

$$f_o = \frac{N_1}{N_2} \cdot \frac{Q}{P} \cdot \frac{1}{T_i}$$

$$f_o = \frac{N_1}{N_2} \cdot \frac{Q}{P} \cdot f_i.$$

As will be appreciated by those skilled in the art, the present disclosure is not limited to any specific type of gapper used to generate gapped signals that are provided to the PLL for frequency synthesis and jitter removal. It will also be appreciated that the present disclosure is not limited to any specific type of input signals or any mechanism to generate the input signals. For example, the input signal to the PLL can be a gapped signal with full or half clock resolution, or a signal other than gapped signal.

The jitter mitigation mechanism in accordance with the present disclosure can be performed by adding digital corrections to the PFD output which is typically in a digital form. For example, the averaged frequency of the Gapped CLK, $f_G$, can be given by:

$$f_G = \frac{f_S}{G},$$

where the gapper division, G, is given by $$G = \frac{P}{Q}.$$

The averaged period of the gapped CLK, $T_G$, can be given by:

$$T_G = G \cdot T_S,$$

where, the periods, $T_S$, and $T_G$, can be given by:

$$T_S = \frac{1}{f_S},$$

$$T_G = \frac{1}{f_G}.$$

The averaged period of the gapped CLK, $T_G$, can be expresses as:

$$T_G = \frac{P}{Q} \cdot T_S.$$

After some simple manipulation, the averaged period of the gapped CLK, $T_G$, is given by:

$$T_G = \frac{(Q-Q)+P}{Q} \cdot T_S$$

$$T_G = T_S + \frac{P-Q}{Q} \cdot T_S.$$

Thus, the averaged period of the clock at the gapper output can be regarded as the sum of two terms, where the first one is the full gapper Input CLK period, $T_S$, and the second one is a fraction value of $T_S$. The low-to-high time samples of the gapped CLK occur at discrete locations which are related to $T_S$. In some embodiments, the gapped CLK may use the fraction values to adjust the time of the clock samples. This approach may be limited by the clock resolution of the gapper in certain cases.

In some other embodiments, the fraction values can be added to the time of the Gapped CLK samples to get a more accurate time samples. A virtual clock, which has more accurate time samples than the Gapped CLK, hereinafter called Smooth CLK. The period of the Smooth CLK is equal to the averaged period of the Gapped CLK, $T_G$. The fraction values, $D_i$, that can be added to the time samples of the Gapped CLK can be derived from the values stored in the register Reg0 331 in FIG. 3A, represented as Reg0(i) and given by $$D_i = \frac{Reg0(i)}{Q} \cdot T_S.$$

The values of Reg0(i) are relevant only when the transitions from low-to-high of the Gapped CLK are available. The fraction values, $D_i$, can be also expressed as a function of the averaged Gapped CLK period $T_G$, $$D_i = \frac{Reg0(i)}{P} \cdot T_G.$$

As an alternative to adding the fraction values to the Gapped CLK, equivalently the fraction values can be added at the phase detector output which is typically in a digital form.

The fraction values of the Smooth CLK need an adjustment, so the clock with a period of $T_G$ will have, on average, a zero offset relative to the Gapped CLK. This virtual clock is called Synced CLK. Thus, the mean value of D is subtracted from each $D_i$. The Synced CLK, which has a period of $T_G$, has a zero phase offset relative to the clock in the feedback path at the phase detector when the PLL is locked.

Figure 4:
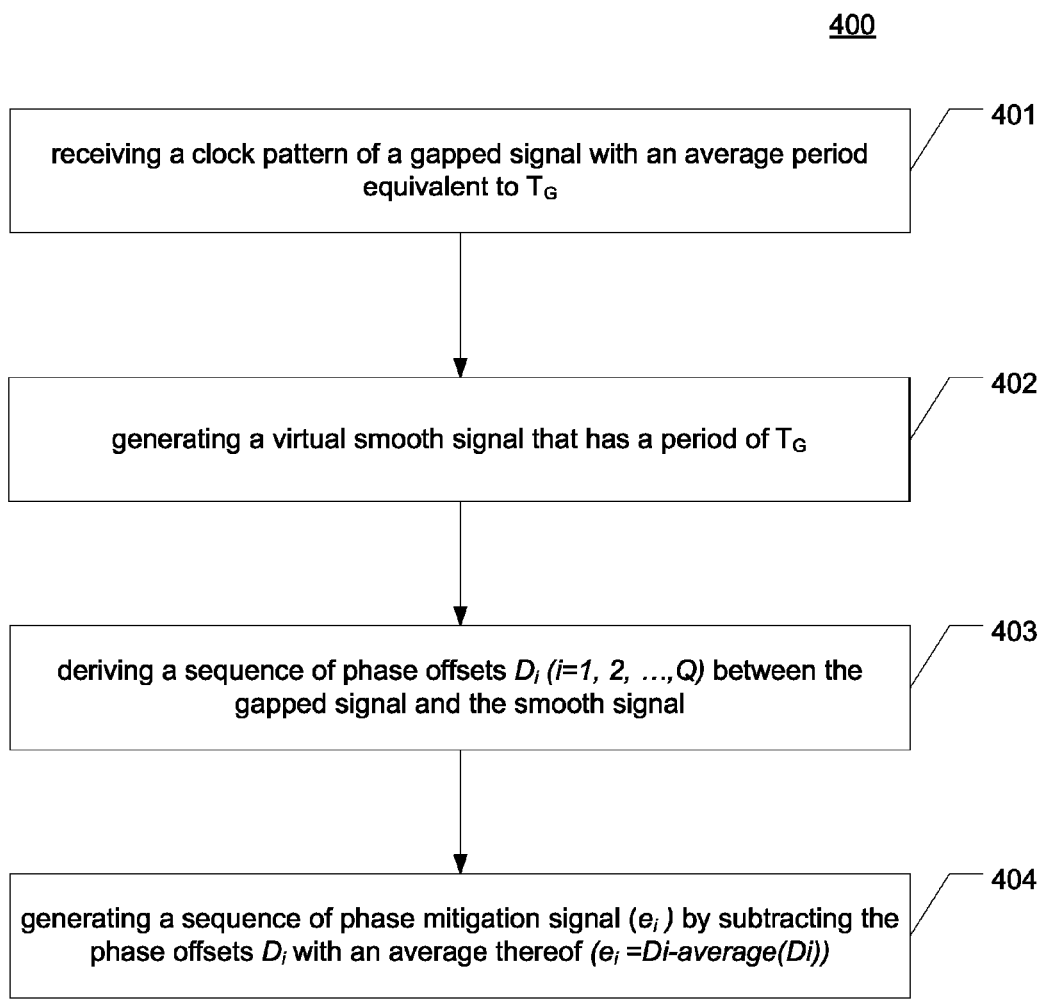
FIG. 4 is flow chart illustrating an exemplary method of generating a sequence of correction values used to offset the phase error signal in accordance with an embodiment of the present disclosure.

FIG. 4 is flow chart illustrating an exemplary method 400 of generating a sequence of correction values used to offset the phase error signal in accordance with an embodiment of the present disclosure. Method 400 can be implemented in circuits or a software. At 401, a lock pattern of a gapped signal with an average period equal to $T_G$ is accessed. At 402, a virtual smooth signal, e.g., the Smooth CLK as described above, can be generated with a period equal to $T_G$. At 403, a sequence of phase offsets values $D_i$ between the gapped signal and the smooth signal can derived. At 404, a sequence of correction values $e_i$ can be derived by subtracting each $D_i$ with an average thereof, e.g., $e_i = D_i - \text{mean}(D_i)$.

The relationship between the different clocks may be different in the cases where the gapper is disposed at the output of the divider N2, as to be described in greater details below.

Figure 5A:
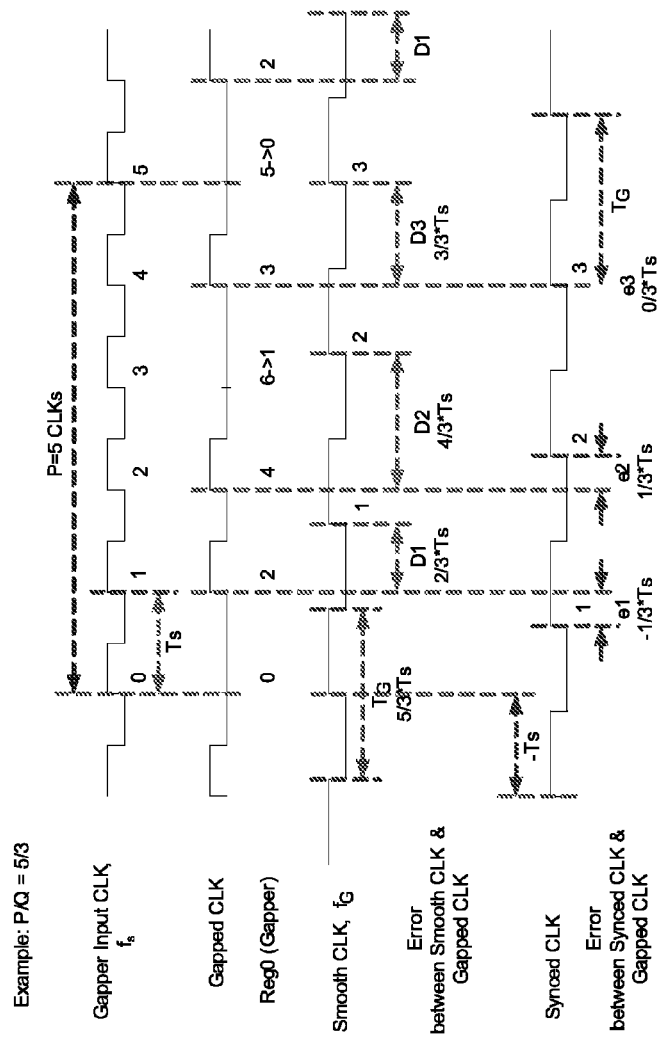
FIG. 5A are clock diagrams illustrating the exemplary phase errors between the Smooth CLK and Synced CLK relative to the Gapped CLK that has G=5/3 where an integer divider is coupled at an input of the gapper in accordance with an embodiment of the present disclosure.

FIG. 5A are clock diagrams illustrating the exemplary phase errors between the Smooth CLK and Synced CLK relative to the Gapped CLK that has G=5/3 where an integer divider is coupled at an input of the gapper in accordance with an embodiment of the present disclosure. In this example, the Smooth CLK is derived from the Gapped CLK. The phase offsets between the Smooth CLK and Gapped CLK, $D_i$, can be derived from the Reg0 as shown in FIG. 3A for example, and have the values of $D_1=2T_S/3$, $D_2=4T_S/3$, and $D_3=3T_S/3$. Thus the averaged value of $D_i$ is mean($D_i$)=$T_S$. The Sync CLK can be derived from the Smooth CLK by shifting it by:

$$-\text{mean}(D_i) = -T_S$$

Then, the phase offset between the Synced CLK and the Gapped CLK, $e_i$, can be given by:

$$e_i = D_i - \text{mean}(D_i).$$

Thus, the averaged phase offset between Synced CLK and Gapped CLK, mean($e_i$), is substantially zero. Since the mean error between the Gapped CLK and the Synced CLK is zero, the Synced CLK is synchronized with the expected CLK at the feedback path of the phase detector when the PLL is locked. The errors, $e_i$, can be subtracted digitally at the phase detector output. They do not affect the loop performance because their mean is zero. After subtracting the errors $e_i$, the nominal phase detector output becomes zero. Thus, the noise that is present at the phase detector output of a conventional PLL is mostly removed.

Figure 5B:
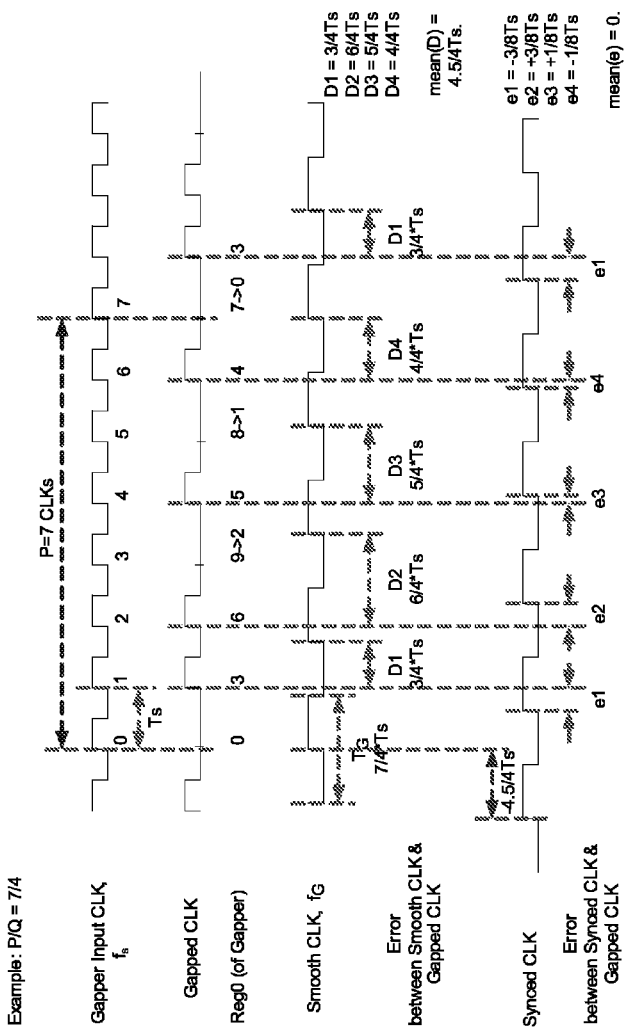
FIG. 5B are clock diagrams illustrating the exemplary phase errors between the Smooth CLK and Synced CLK relative to the Gapped CLK that has G=7/4 where an integer divider is coupled at an input of the gapper in accordance with an embodiment of the present disclosure.

FIG. 5B are clock diagrams illustrating the exemplary phase errors between the Smooth CLK and Synced CLK relative to the Gapped CLK that has G=7/4 where an integer divider is coupled at an input of the gapper in accordance with an embodiment of the present disclosure. The averaged of the delays between the Smooth CLK and Gapped CLK is given by:

$$\text{mean}(D_i) =$$

$$\text{mean}(D_1, D_2, D_3, D_4) = \text{mean}\left(\frac{3}{4} \cdot T_S, \frac{6}{4} \cdot T_S, \frac{5}{4} \cdot T_S, \frac{4}{4} \cdot T_S\right) = \frac{4.5}{4} \cdot T_S$$

The Synced CLK can be generated by shifting the Smooth CLK by $-4.5\, T_S/4$. The averaged phase difference between the virtual Synced CLK and Gapped CLK is zero.

Figure 6:
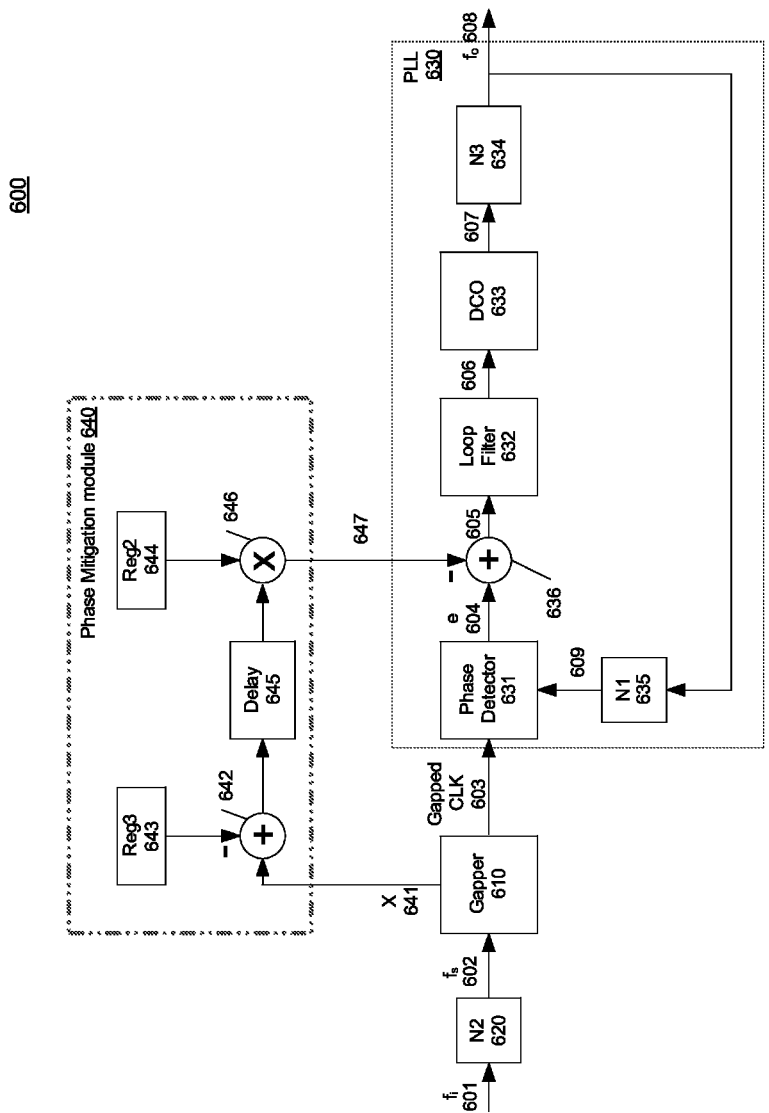
FIG. 6 is a block diagram illustrating an exemplary configuration of a PLL-based frequency synthesizer that has a gapper located after the divider N2 and is equipped with a phase mitigation module in accordance with an embodiment of the present disclosure.

FIG. 6 is a block diagram illustrating an exemplary configuration of a PLL-based frequency synthesizer 600 that has a gapper 610 located after the divider N2 620 and is equipped with a phase mitigation module 640 in accordance with an embodiment of the present disclosure. In this example, the gapper 610 has the similar configuration as 300 FIG. 3A.

The phase mitigation module 640 comprises an input 641 coupled to the Reg0 in the gapper 610, registers Reg3 643 and Reg2 644, an adder 642, a delay circuit 645, and a multiplier 646. Reg3 643 and Reg2 644 are used to store respective predetermined values. The phase mitigation module 640 can subtract value in Reg3 from the sequence of X by using the adder 642. The results are delayed through the delay circuit 645 and then multiplied by the value in Reg2 644 to generate the sequence of correction values 647. The adder 636 can subtract the correction values 647 from the output of the PFD 631 in discrete locations and output a mitigated phase error signal 605 provided to control the DCO 633.

The input clock $f_i$ 601 is first divided by N2 620 and then the gapper 610 divides the clock 601 by G=P/Q. In this implementation, the divider N2 620 is placed before the Gapper 610. The order of the divider N2 620 and gapper 610 does not affect the averaged period of the phase detector forward path input. However, the Gapped CLK has higher jitter than the case where the divider N2 is after the Gapper, but the larger jitter may not be a concern according to the present disclosure because the jitter can be removed significantly. In some embodiments, a higher range of phase detector that can handle phase errors beyond the usual range of ($-2\pi$ to $+2\pi$) can be used. The Gapper 610, which is located after the divider N 620, can use a lower clock which can advantageously simplify its design and may save power.

The Gapper 610 can output the Reg0 value, X 641, synchronized with the Gapped CLK transitions of low-to-high.

The Smooth CLK has an offset, $D_i$, relative to the Gapped CLK. The values of $D_i$ can be expressed as a function of Reg0(i), and are given by:

$$D_i = \frac{Reg0(i)}{Q} \cdot T_S,$$

or $$D_i = \frac{Reg0(i)}{P} \cdot T_G.$$

The Reg3 643 can be set to the averaged value of Di, where Ts/Q is normalized by 1. Ts/Q is used later in Reg2. The value of Reg3 643 can be a function of P and Q. It can be calculated ahead of time, or the calculation can be done in hardware by the summation of the values of Reg0(i) over one period of P gapper input clocks.

The value of Reg3 can be calculated by:

$$Reg3 = \frac{1}{Q} \cdot \sum_{i=1}^{Q} Reg0(i).$$

Reg2 644 can be set to the value of:

$$Reg2 = k \cdot \frac{T_G}{P},$$

where the constant gain, k, is related to the gain of the PFD 631.

The delay of delay circuit 645 can compensate for the delay of the PFD 631,

The value of $T_G$ can be expressed as:

$$T_G = N_1 \cdot T_O,$$

where the output period, $T_O$, can be related to the period of the DCO output clock, TDCO, by:

$$T_o = N_3 \cdot T_{DCO}.$$

Thus, the value of Reg2 can be expressed as:

$$Reg2 = k \cdot \frac{N_1 \cdot N_3}{P} \cdot T_{DCO}.$$

In some embodiments, the phase detector operates with the DCO 633 output clock, and therefore, the PFD output 604 can be calculated in units of $T_{DCO}$. Thus, $T_{DCO}$ can be normalized to 1. Therefore, Reg2 setting can be:

$$Reg2 = k \cdot \frac{N_1 \cdot N_3}{P}.$$

Figure 7:
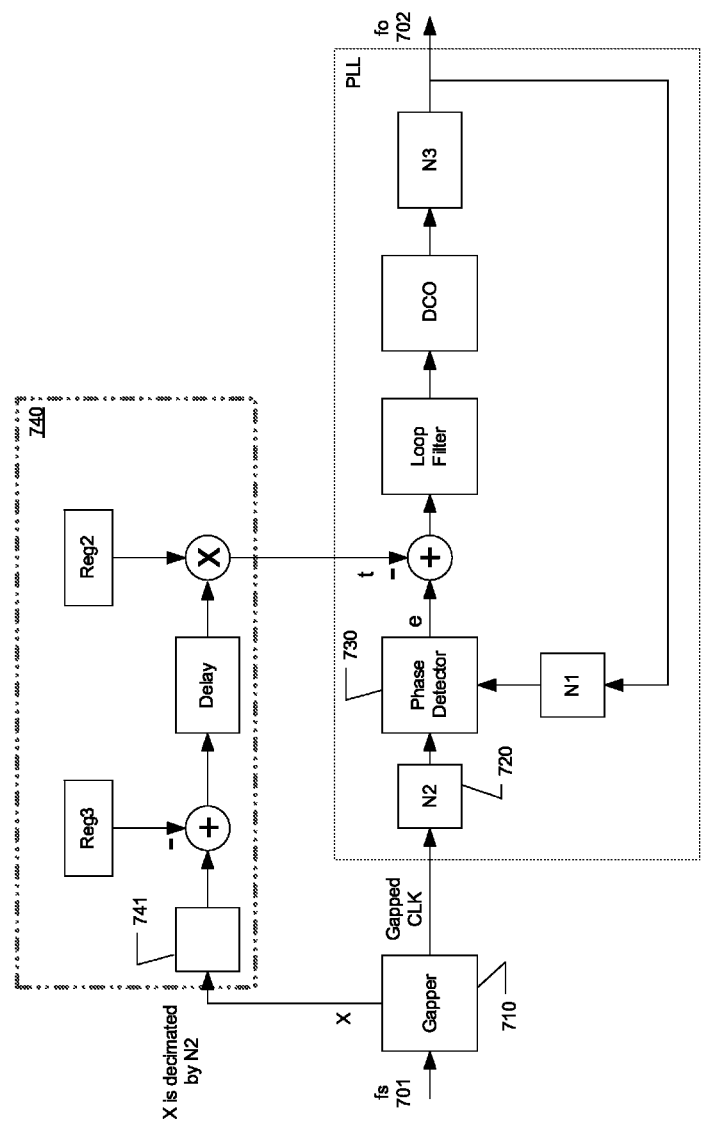
FIG. 7 is a block diagram illustrating an exemplary configuration of a PLL-based frequency synthesizer that has a gapper disposed before the divider N2 and is equipped with a phase mitigation module in accordance with an embodiment of the present disclosure.

FIG. 7 is a block diagram illustrating an exemplary configuration of a PLL-based frequency synthesizer 700 that has a gapper 710 disposed before the divider N2 720 and is equipped with a phase mitigation module 740 in accordance with an embodiment of the present disclosure. In this example, the gapper 710 has the similar configuration as 300

FIG. 3A. The advantage of this embodiment is that the PFD 730 can handle relative wider phase offsets between the input clock 701 and the output clock 702. The phase mitigation module comprises a decimator 741 to decimate the X values output from the gapper by a factor of N2.

The value of Reg3 is a function of P, Q and N2, and can be calculated ahead of time via software, or can be implemented in hardware. The value set into Reg3 can be obtained from the averaged value of the phase differences between (Smooth CLK)/N2 and (Gapped CLK)/N2. The phase differences between (Smooth CLK)/N2 and (Gapped CLK)/N2 can be obtained by decimating by N2 the phase difference between Smooth CLK and Gapped CLK, $D_i$.

The value of Reg3 can be given by:

$$Reg3 = \frac{1}{Q} \cdot \sum_{\substack{i=1 \\ \text{Decimated} \\ \text{by } N2}}^{Q} Reg0(i).$$

The phase offset, which is set into Reg3, can be subtracted from the virtual (Smooth CLK)/N2 to obtain the virtual (Sync CLK)/N2. The (Sync CLK)/N2 has a zero phase offset relative to the divider N2 output (Gapped CLK)/N2. Therefore, (Sync CLK)/N2 is equivalent to the clock at the feedback leg of the phase detector when the PLL is locked. After the corrections of the phase detector outputs, the signal that goes into the loop filter is nominally zero when the PLL is locked. Therefore, the PLL does not need to filter any jitter generated by the Gapper.

In some embodiments, the state of the divider N2 can be synchronized with the Gapper state. For example, when the Reg0 of the Gapper is zero, the N2 output becomes zero as well. In addition, the decimation by N2 of X should also be synchronized with the Gapper state, where the decimator output first value is Reg0(1) which is the first value of Reg0 after zero.

Figure 8A:
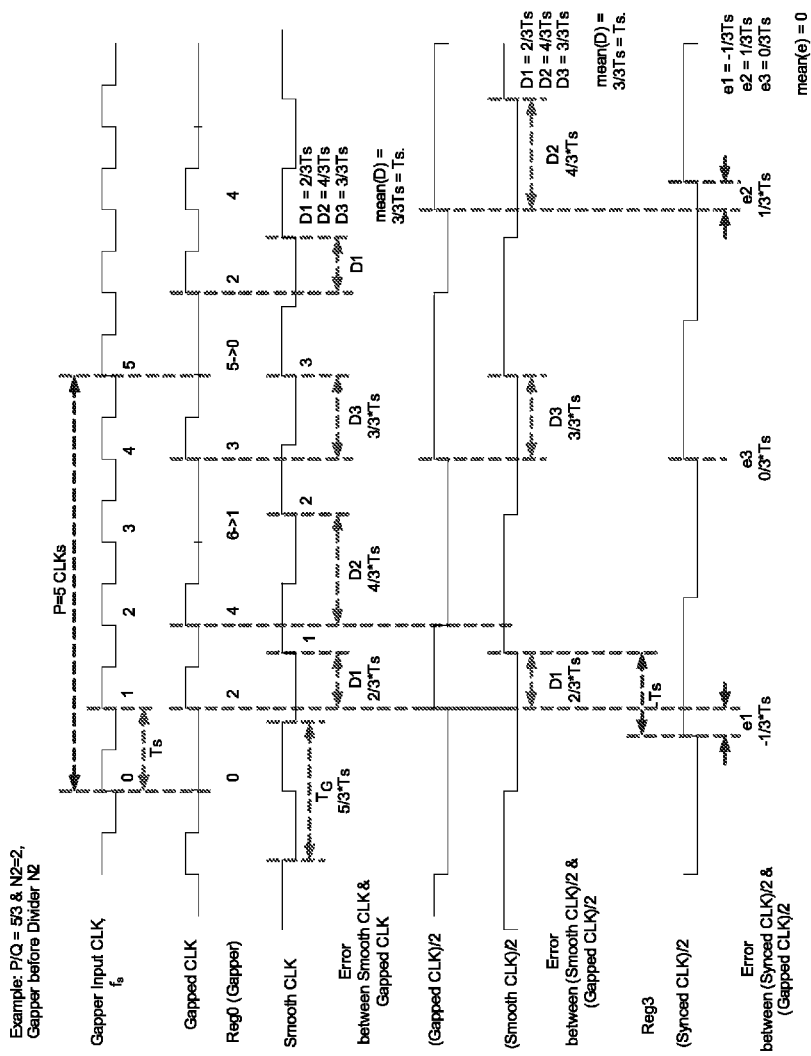
FIG. 8A are clock diagrams illustrating the exemplary phase errors between the Smooth CLK and Synced CLK relative to the Gapped CLK that has G=5/3 where an integer divider N2 is coupled at an output of the gapper in accordance with an embodiment of the present disclosure.

FIG. 8A are clock diagrams illustrating the exemplary phase errors between the Smooth CLK and Synced CLK relative to the Gapped CLK that has G=5/3 where an integer divider N2 is coupled at an output of the gapper in accordance with an embodiment of the present disclosure. In this example, N2 is equal to 2. The period of the virtual Smooth CLK is the same as the averaged period of the Gapped CLK. The phase differences between Smooth CLK and Gapped CLK, Di, are derived from the values Reg0(i). The Smooth CLK divided by N2=2 is represented as (Smooth CLK)/2. The phase offset between (Smooth CLK)/2 and (Gapped CLK)/2 is derived by decimating $D_i$ by N2, where Di is the phase difference between Smooth CLK and Gapped CLK. In our example, the phase difference between (Smooth CLK)/2 and (Gapped CLK)/2 is given by D1, D3, D2, D1, . . . , which is obtained by decimating Di by N2=2. Note that the Gapped CLK division by N2 is synchronized to the Gapper, by making sure that the (Gapped CLK)/2 is zero when the Gapper Reg0 value is zero.

The value set into Reg3 is obtained from the averaged value of the phase differences between (Smooth CLK)/2 and (Gapped CLK)/2, where Ts/Q is normalized to 1 because it's used later in Reg2. In the example above, the value of Reg3 can be obtained from:

$$Reg3 = \text{mean}(D_1, D_3, D_2) = \text{mean}\left(\frac{2}{3}, \frac{4}{3}, \frac{3}{3}\right) = \frac{3}{3} = 1$$

The phase offset, which is set into Reg3, is subtracted from the (Smooth CLK)/2 to obtain (Sync CLK)/2. The (Sync CLK)/2 has a zero phase offset relative to the divider N2 output (Gapped CLK)/2. Therefore, (Sync CLK)/2 is equivalent to the clock at the feedback leg of the phase detector when the PLL is locked. As the mean of the corrections at the phase detector output is zero, any error due to limited resolution may affect the loop performance significantly.

In some embodiments, the divider N2 can be split into 2 values, N2a and N2b, where, $$N2 = N2a \cdot N2b.$$

A divider of N2a can be set before the Gapper and a divider of N2b can be set after the Gapper. In this case, the decimator can decimate the Di value by a factor of N2b.

Figure 8B:
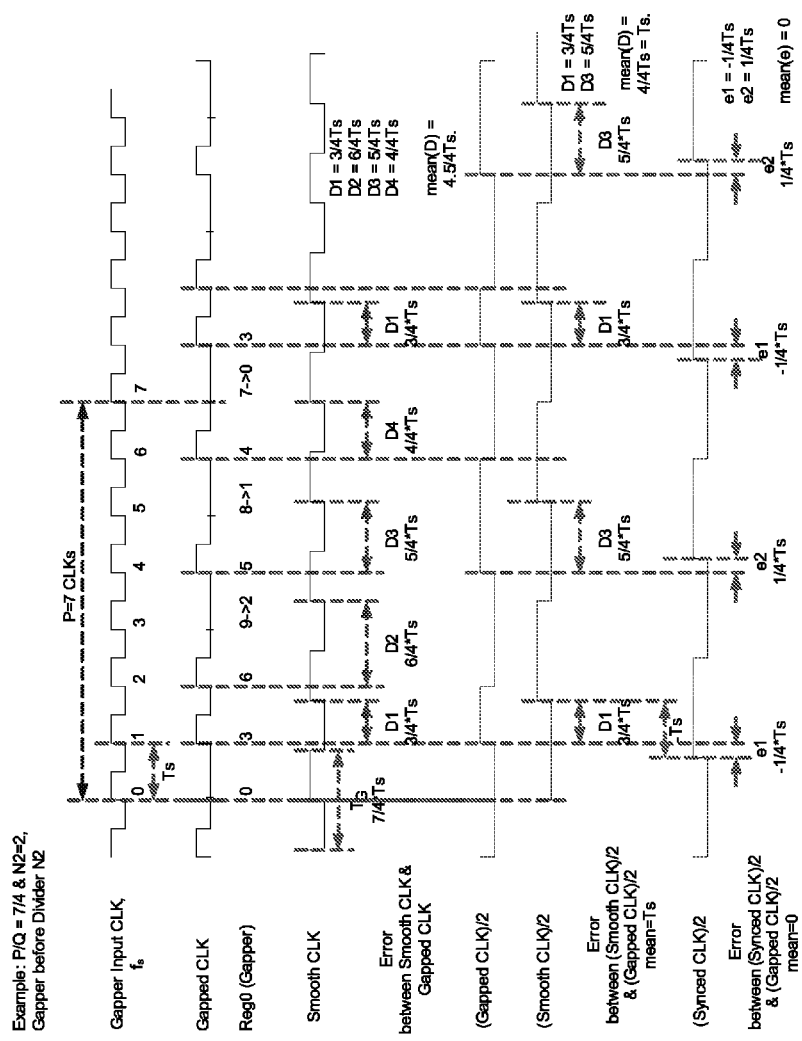
FIG. 8B are clock diagrams illustrating the exemplary phase errors between the Smooth CLK and Synced CLK relative to the Gapped CLK that has G=7/4 where an integer divider N2 is coupled at an output of the gapper in accordance with an embodiment of the present disclosure.

FIG. 8B are clock diagrams illustrating the exemplary phase errors between the Smooth CLK and Synced CLK relative to the Gapped CLK that has G=7/4 where an integer divider N2 is coupled at an output of the gapper in accordance with an embodiment of the present disclosure. The averaged of the delays between (Smooth CLK)/2 and (Gapped CLK)/2 are given by:

$$\text{mean}(D_1, D_3) = \text{mean}\left(\frac{3}{4} \cdot Ts, \frac{5}{4} \cdot Ts\right) = \frac{4}{4} \cdot Ts$$

$D_i$ is decimated by N2=2, giving a sequence of 1, 3, 1, 3, . . . . So the averaging is done on only two values of $D_i$, $D_1$ and $D_2$. Reg3 is set by the value of 4.

The virtual (Synced CLK)/2 can be generated by shifting the (Smooth CLK)/2 by –Ts. The averaged phase difference between the (Synced CLK)/2 and (Gapped CLK)/2 is zero.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law

What is claimed is:

1. A method of reducing jitter from input signals, said method comprising:
   providing an input signal to a phase locked loop (PLL), wherein said input signal comprises jitter components;
   generating a first phase error signal based on phase frequency differences between said input signal and a feedback signal of said PLL; and
   generating a second phase error signal by offsetting said first phase error signal with a sequence of correction values, wherein an average of said sequence of correction values is substantially equal to zero, and wherein further an average of said second phase error signal is substantially equal to zero.

2. The method of claim 1, wherein determining the sequence of correction values is based on phase frequency differences between said gapped signal and a targeted feedback signal of said PLL, and is further based on locations in time of said jitter components, and wherein said targeted feedback signal is substantially free of jitter and has a period substantially equal to average period of said gapped signal.

3. The method of claim 1, wherein said input signal comprises a gapped signal that comprises an equivalent of Q pulses in P clocks cycles, wherein P and Q are integers and P is greater than Q.

4. The method of claim 3, wherein said gapped signal has an average period of $T_G$ and is generated based on an input clock by:
   defining a number M1 and a number M2 based on P and Q;
   generating a sequence of $R_i$ in accordance with $R_i=(M1+R_{i-1})$ mod M2, wherein $R_i$ is a variable, wherein $i=1, 2, \ldots$;
   generating a gapping control indication if $(M1+R_i) \geq M2$; and
   removing at least a portion of a pulse from said input clock in response to said gapping control indication.

5. The method of claim 4, wherein said M1 is equal to (P−Q), and wherein said M2 is equal to P.

6. The method of claim 5, wherein determining said sequence of correction values, representable as $e_j$, comprises:
   accessing a sequence of offset values representable as $D_j$, wherein $j=1, 2, \ldots Q$, wherein $D_j=T_G R_k/P$, wherein k is selected from $i=1, 2, \ldots P$, wherein a respective $R_k$ is equal to a $R_i$ corresponding to a rising edge of said gapped signal;
   subtracting an average of said sequence of offset values, representable as mean $(D_j)$ from said sequence of offset values $D_j$ to generate a first sequence of numbers; and
   multiplying said first sequence of numbers with a predefined numbers that is proportional to 1/P.

7. The method of claim 6, wherein said offsetting said phase error signal comprises subtracting said sequence of correction values from said first phase error signal.

8. The method of claim 5, wherein said sequence of correction values are determined by:
   deriving a smooth virtual signal by adding a sequence of phase offset values to said gapped signal, representable as $D_j$, wherein $j=1, 2, \ldots, Q$, wherein $D_j=T_G R_k/P$, wherein k is selected from $i=1, 2, \ldots P$, wherein a respective $R_k$ is equal to a $R_i$ corresponding to a rising edge of said gapped signal, and wherein said smooth virtual signal has a period substantially equal to $T_G$;
   computing an average of said sequence of phase offset values, representable as mean $(D_j)$;
   shifting said smooth virtual signal by a negative of mean $(D_j)$ to derive a synchronized virtual signal; and
   deriving said sequence of correction values based on phase frequency differences between said gapped signal and said synchronized virtual signal.

9. A device for frequency synthesizing, said device comprising:
   a phase locked loop (PLL) comprising: a phase frequency detector configured to detect a phase frequency difference between an input signal and a feedback signal of said PLL, and to generate a phase error signal, and a feedback loop, wherein said input signal has an average period of $T_G$; and
   a phase mitigation module coupled to said phase frequency detector and configured to modify said phase error signal into a mitigated phase error signal based on a sequence of phase mitigation values that have an average substantially equal to zero, and wherein further an average of said mitigated phase error signal is substantially equal to zero.

10. The device of claim 9, wherein said phase mitigation values are derived based on phase frequency differences between said input signal and a targeted feedback signal of said PLL, wherein said targeted feedback signal is determined based on a predicated signal pattern of said input signal, and wherein said targeted feedback signal is free of jitter and has a period equal to an average period of said input signal.

11. The device of claim 9 further comprising a gapper coupled to said phase frequency detector and configured to generate a gapped signal as said input signal in response to an input clock, said gapped signal comprising an equivalent of Q pulses in P clock cycles, and wherein P and Q are integers and P is greater than Q.

12. The device of claim 11, wherein said gapper comprises:
   a Delta Sigma Modulator (DSM) configured to:
      generate a sequence of $R_i$ in accordance with $R_i=(M1+R_{i-1})$ mod M2, wherein $R_i$ is a variable, and wherein $i=1, 2, \ldots, P$, wherein M1 and M2 are integers derived from P and Q; and
      generate a gapping control indication if $(M1+R_i) \geq M2$; and
   a pulse removal unit operable to remove at least a fraction of a pulse from said input clock in response to said gapping control indication and to output said gapped signal,
   wherein said DMS is configured to output a subset of said sequence of $R_i$, said subset representable as $X_j$ and corresponding to rising edges of pulses in said gapped signal, and wherein $j=1, 2, \ldots, Q$.

13. The device of claim 12, wherein said phase mitigation module comprises:
   a first register configured to store a first value representing a mean of a sequence of offsets $D_j$, wherein said sequence of offsets $D_j = X_j \times T_G/P$;
   a second register configured to store a second value that is proportional to k/P, wherein k represents a gain of said phase frequency detector;
   a first adder coupled to said first register and said gapper and operable to subtract said first value from said sequence of offsets;
   a delay component coupled between said first adder and a multiplier, said delay component operable to add a time interval based on a time delay of said phase frequency detector;
   wherein said multiplier is coupled to said second register and said delay component, said multiplier configured to multiply an output of said delay component by said second value; and
   a second adder coupled to an output of said phase frequency detector and operable to subtract said sequence of phase mitigation values from said phase error signal, and to provide said mitigated phase error signal to said oscillating component.

14. The device of claim 13, wherein said device further comprises a first integer divider with a division ratio of N1 disposed in said feedback loop, and a second integer divider with a division ratio of N2 and coupled to an output of said oscillating component, wherein said second value is equal to $k \times N1 \times N2/P$.

15. The device of claim 4, wherein said device further comprises a third integer divider with a divide ratio of N3 and coupled between said gapper and said an input of said phase frequency detector, and wherein said phase mitigation module further comprises a decimation component coupled between said gapper and said first adder, wherein said decimation component is operable to decimate said $X_j$ by N2.

16. A circuit for frequency synthesis, said circuit comprising:
- a phase locked loop (PLL) coupled to a gapper, said PLL comprising:
  - a phase frequency detector configured to detect a phase frequency difference between a first gapped signal at an input of said PLL and a feedback signal of said PLL, and to generate a phase error signal;
  - a first divider with divide ratio of N1 coupled to an output of an oscillating component; and
  - a second divider with divide ratio of N2 coupled to a feedback loop of said PLL; and
- a phase mitigation module coupled to said phase frequency detector and configured to modify said phase error signal to produce a mitigated phase error signal based on a sequence of phase mitigation values that have an average substantially equal to zero, and wherein further an average of said mitigated phase error signal is substantially equal to zero.

17. The circuit of claim 16, wherein said phase mitigation values are derived based on phase frequency differences between said first gapped signal and a targeted feedback signal of said PLL, wherein said targeted feedback signal is determined based on a predicated signal pattern of said first gapped signal, wherein said targeted feedback signal is free of jitter and has a period equal to an average period of said first gapped signal, and wherein said first gapped signal comprising an equivalent of Q pulses in P clock cycles, wherein P and Q are integers and P is greater than Q.

18. The circuit of claim 17 comprising said gapper coupled to said phase frequency detector, wherein said gapper comprises:
- a Delta Sigma Modulator (DSM) configured to:
  - generate a sequence of $R_i$ in accordance with $R_i=(M1+R_{i-1}) \bmod M2$, wherein $i=1, 2, \ldots, P$, wherein M1 and M2 are integers derived from P and Q; and
  - generate a pulse removal indication if $(M1+R_i) \geq M2$; and
- a pulse removal unit operable to remove at least a fraction of a pulse from an input clock of said gapper in response to said pulse removal indication, and to output a second gapped signal,
- wherein said DMS is configured to output a subset of said sequence of $R_i$, said subset representable as $X_j$ and corresponding to rising edges of pulses in said second gapped signal, and wherein $j=1, 2, \ldots, Q$.

19. The circuit of claim 18 further comprising a third divider with a divide ratio of N3 coupled to an output of said gapper, wherein said gapped signal has an average period of $T_G$, and wherein said gapped signal is equivalent to said second gapped signal divided by N3, and wherein said phase mitigation module comprises:
- a decimation component configured to decimate said subset $X_j$;
- a first register storing a first value proportional to a mean of a sequence of offsets $D_j$, wherein said sequence of offsets $D_j=X_j \times T_G/P$;
- a second register storing a second value that is proportional to k/P, wherein k represents a gain of said phase frequency detector;
- a first adder coupled to said first register and said gapper and operable to subtract said first value from said sequence of offsets;
- a delay component coupled between said first adder and a multiplier, said delay component operable to add a time interval based on a time delay of said phase frequency detector;
- wherein said multiplier is coupled to said second register and said delay component, said multiplier configured to multiply an output of said delay component by said second value; and
- a second adder is coupled to an output of said phase frequency detector and operable to subtract said sequence of phase mitigation values from said phase error signal, and to provide said mitigated phase error signal to said oscillating component.

20. The circuit of claim 18 further comprising a third integer divider coupled to an input of said gapper and said phase frequency detector, wherein said gapped signal has an average period of $T_G$, wherein said phase mitigation module comprises:
- a first register storing a first value proportional to a mean of a sequence of offsets $D_1$, wherein said sequence of offsets $D_j=X_j \times T_G/P$;
- a second register storing a second value that is proportional to k/P, wherein k represents a gain of said phase frequency detector;
- a first adder coupled to said first register and said gapper and operable to subtract said first value from said sequence of offsets;
- a delay component coupled between said first adder and a multiplier, said delay component operable to add a time interval based on a time delay of said phase frequency detector;
- wherein said multiplier is coupled to said second register and said delay component, wherein said multiplier is configured to multiply an output of said delay component by said second value; and
- wherein a second adder is coupled to an output of said phase frequency detector and is configured to subtract said sequence of phase mitigation values from said phase error signal, and to provide said mitigated phase error signal to said oscillating component.

\* \* \* \* \*